United States Patent
Shumarayev et al.

(10) Patent No.: US 6,831,480 B1
(45) Date of Patent: Dec. 14, 2004

(54) PROGRAMMABLE LOGIC DEVICE MULTISPEED I/O CIRCUITRY

(75) Inventors: Sergey Y. Shumarayev, San Leandro, CA (US); Rakesh H. Patel, Cupertino, CA (US)

(73) Assignee: Altera Corporation, San Jose, CA (US)

( * ) Notice: Subject to any disclaimer, the term of this patent is extended or adjusted under 35 U.S.C. 154(b) by 4 days.

(21) Appl. No.: 10/338,920

(22) Filed: Jan. 7, 2003

(51) Int. Cl.[7] .................................................. G06F 7/38
(52) U.S. Cl. ............................ 326/38; 326/37; 326/39; 326/41
(58) Field of Search ............................... 326/37–39, 41, 326/49; 710/100

(56) References Cited

U.S. PATENT DOCUMENTS

| | | | |
|---|---|---|---|
| 3,473,160 A | 10/1969 | Wahlstrom | |
| 4,486,739 A | 12/1984 | Franaszek et al. | |
| 4,527,079 A | 7/1985 | Thompson | |
| 4,658,156 A | 4/1987 | Hashimoto | |
| 4,853,560 A | 8/1989 | Iwamura et al. | |
| 5,059,835 A | 10/1991 | Lauffer et al. | |
| 5,067,007 A | 11/1991 | Otsuka et al. | |
| 5,144,167 A | 9/1992 | McClintock | |
| 5,268,598 A * | 12/1993 | Pedersen et al. | 326/39 |
| RE34,808 E | 12/1994 | Hsieh | |
| 5,371,422 A * | 12/1994 | Patel et al. | 326/41 |
| 5,521,530 A | 5/1996 | Yao et al. | |
| 5,557,219 A | 9/1996 | Norwood et al. | |
| 5,589,783 A | 12/1996 | McClure | |
| 5,689,195 A | 11/1997 | Cliff et al. | |
| 5,742,178 A | 4/1998 | Jenkins, IV et al. | |
| 5,764,080 A * | 6/1998 | Huang et al. | 326/41 |
| 5,801,548 A | 9/1998 | Lee et al. | |
| 5,936,423 A | 8/1999 | Sakuma et al. | |
| 5,939,904 A | 8/1999 | Fetterman et al. | |
| 5,958,026 A | 9/1999 | Goetting et al. | |
| 5,970,255 A | 10/1999 | Tran et al. | |
| 5,974,476 A * | 10/1999 | Lin et al. | 710/14 |
| 6,175,952 B1 | 1/2001 | Patel et al. | |

(List continued on next page.)

FOREIGN PATENT DOCUMENTS

EP      0 575 124      12/1993

OTHER PUBLICATIONS

"A 3.3–V Programmable Logic Device that Addresses Low Power Supply and Interface Trends," IEEE 1997 Custom Integrated Circuits Conference, May 1997, pp. 539–42. —Patel et al..

(List continued on next page.)

Primary Examiner—Michael Tokar
Assistant Examiner—Khai Nguyen
(74) Attorney, Agent, or Firm—Townsend and Townsend and Crew LLP

(57) ABSTRACT

Programmable logic device integrated circuitry having I/O circuitry portions having different maximum speed capabilities and different amounts of programmability for supporting various I/O signaling standards is provided. High-speed I/O circuitry and low-speed I/O circuitry may be provided. The high-speed I/O circuitry may have differential I/O drivers and may not be programmable. Relatively few I/O lines may be connected to the high-speed I/O circuitry. The low-speed I/O circuitry may be programmable so that a user may configure the low-speed I/O circuitry to support different I/O signaling standards. Intermediate-speed I/O circuitry may be provided that is more flexible than the high-speed circuitry and operates at higher maximum I/O data rates than the low-speed I/O circuitry. Transmitter circuitry (output driver circuitry) in the I/O circuitry may be provided with the ability to handle a greater number of different I/O signaling standards than receiver circuitry (input driver circuitry) in the I/O circuitry.

20 Claims, 6 Drawing Sheets

U.S. PATENT DOCUMENTS

| | | | | |
|---|---|---|---|---|
| 6,215,326 | B1 | | 4/2001 | Jefferson et al. |
| 6,236,231 | B1 | * | 5/2001 | Nguyen et al. ............... 326/39 |
| 6,239,612 | B1 | * | 5/2001 | Shiflet .......................... 326/39 |
| 6,239,615 | B1 | * | 5/2001 | Ngai et al. .................... 326/41 |
| 6,252,419 | B1 | | 6/2001 | Sung et al. |
| 6,271,679 | B1 | * | 8/2001 | McClintock et al. ......... 326/38 |
| 6,400,598 | B1 | | 6/2002 | Nguyen et al. |
| 6,407,576 | B1 | | 6/2002 | Ngai et al. |
| 6,433,579 | B1 | * | 8/2002 | Wang et al. ................... 326/38 |
| 6,472,903 | B1 | * | 10/2002 | Veenstra et al. .............. 326/38 |
| 6,480,026 | B2 | * | 11/2002 | Andrews et al. .............. 326/39 |
| 6,590,419 | B1 | * | 7/2003 | Betz et al. ..................... 326/47 |
| 6,650,141 | B2 | * | 11/2003 | Agrawal et al. .............. 326/41 |
| 2002/0190751 | A1 | | 12/2002 | Lee et al. |

OTHER PUBLICATIONS

"APEX20KC programmable Logic Device Data Sheet", Apr. 2002 ver. 2.1, pp. 1–8.

"APEX II Programmable Logic Device Family Data Sheet", Apr. 2001 ver. 1.0, pp. 24–36.

"Block Diagram for NSM LVDS Output Buffer", "Circuit Trace from National Semiconductor Device", National Semiconductor Corporation. —No date provided.

"Lucent Introduces 10Gb/s Ethernet FPGAs", Programmable Logic News and Views, Electronic Trend Publications, Inc., vol. IX, No. 11, Nov. 2000, pp. 7–8.

"LVDS Owner's Manual; Design Guide", National Semiconductor Corporation, Spring 1997, Chapter 1, pp. 1–7.

Mercury Programmable Logic Device Family Data Sheet, Mar. 2002, ver. 2.0, pp. 1–60.

"ORCA ORT82G5 0.622/1.0–1.25/2.0–2.5/3.125 Gbits/s Backplane Interface FPSC", Product Brief, Feb. 2001, Lucent Technologies Inc., pp. 1–8.

"Protocol Independent Gigabit Backplane Transceiver Using Lucent ORT4622/ORT8850 FPSCs", Application Note, Jun. 2000, Lucent Technologies Inc., pp. 1–10.

"Using HSDI in Source–Synchronous Mode in Mercury Devices, Application Note 159", Altera Corporation, Sep. 2001, ver. 1.0.

"Using Phase Locked Loop (PLLs) in DL6035 Devices, Application Note", Dyna Chip Corporation, Sunnyvale, CA, 1998, pp. i and 1–6.

"Using the Virtex Delay–Locked Loop, Application Note, XAPP132, Oct. 21, 1998 (Version 1.31)", Xilinx Corporation, Oct. 21, 1998, pp. 1–14.

"Virtex™—E 1.8V Field Programmable Gate Arrays Preliminary Product Specification", Xilinx, DS022–2 (vs.3), Nov. 9, 2001, pp. 1–52.

"Virtex–II 1.5V Field–Programmable Gate Arrays Advance Product Specification", Xilinx, DS031–2 (v2.0), Jul. 16, 2002.

"Virtex 2.5V Field Programmable Gate Arrays, Advanced Product Specification, Oct. 20, 1998 (Version 1.0)", Xilinx Corporation, Oct. 20, 1998, pp. 1–24.

DY6000 Family, FAST Field Programmable Gate Array, DY6000 Family Datasheet, Dyna Chip Corporation, Sunnyvale, CA, Dec. 1998, pp. 1–66.

Optimized Reconfigurabl Cell Array (ORCA), OR3Cxxx/OR3Txxx Series Field–Programmable Gate Arrays, Preliminary Product Brief, Lucent Technolgies Inc., Microelectronics Group, Allentown, PA, Nov. 1997, pp. 1–7 and unnumbered back cover.

ORCA Series 3 Field–Programmable Gate Arrays, Preliminary Data Sheet, Rev. 01, Lucent Technologies Inc., Microelectronics Group, Allentown, PA, Aug. 1998, pp. 1–80.

Rocket I/O Transceiver User Guide, UG024 (vl.2) Feb. 25, 2002, Xilinx, Inc., pp. 1–106.

Virtex–II Pro Platform FPGA Handbook, UG012 (vl.0) Jan. 31, 2002, Xilinx, Inc., pp. 1–6 27–32. 121–126, and 162–180.

* cited by examiner

PROGRAMMABLE LOGIC DEVICE MULTISPEED I/O CIRCUITRY

BACKGROUND OF THE INVENTION

This application relates to programmable logic array integrated circuits ("programmable logic devices"), and more particularly, to input-output circuitry for programmable logic devices.

Programmable logic devices are integrated circuits that may be programmed by a user to perform various logic functions. Some currently-available programmable logic devices have I/O driver circuitry that can be selectively configured to accommodate different I/O signaling standards. This flexibility enhances the usefulness of such devices, because they may be used in various system environments and may communicate with a broader range of other devices than would otherwise be possible. However, substantial performance penalties may arise if the input-output circuitry of a programmable logic device is made too flexible.

On some currently-available programmable logic devices the transmitters (output drivers) in the I/O circuitry may be made more programmable than the receivers (input drivers) to take advantage of the less-sensitive nature of the transmitters to performance penalties when adding support for multiple-signaling standards. On these devices higher speed I/O circuits may be provided with less programmability to maximize their performance. Performance is enhanced further by reducing the amount of signal conductor area that immediately underlies the flip-chip solder bump pads at the ends of the I/O lines on the programmable logic device.

It is therefore an object of the present invention to provide programmable logic devices that have input-output circuitry with both flexibility and high performance.

SUMMARY OF THE INVENTION

This and other objects of the invention are accomplished in accordance with the principles of the invention by providing a programmable logic device having input-output driver circuitry that is at least partially divided into separate blocks or portions. With this approach, some or all of the highest-speed I/O circuitry may be segregated from the lowest speed I/O circuitry.

The performance penalty for providing flexible I/O driver circuits is relatively low when the I/O speeds involved are low and is relatively high when the I/O speeds are high. Accordingly, the lowest speed I/O circuitry may be provided with more flexibility than the highest speed I/O circuitry while still maintaining good I/O performance. If desired, the I/O circuitry may be subdivided into three or more different types of I/O driver circuits. For example, one I/O circuit type may be used to support high-speed differential signals and may be either not programmable or only slightly programmable. Another I/O circuit type may be used to support intermediate-speed signals (some differential and some not). Yet another I/O circuit type may be used to support low-speed signals.

Further features of the invention, its nature and various advantages will be more apparent from the accompanying drawings and the following detailed description of the preferred embodiments.

DETAILED DESCRIPTION OF THE PREFERRED EMBODIMENTS

Figure 1:
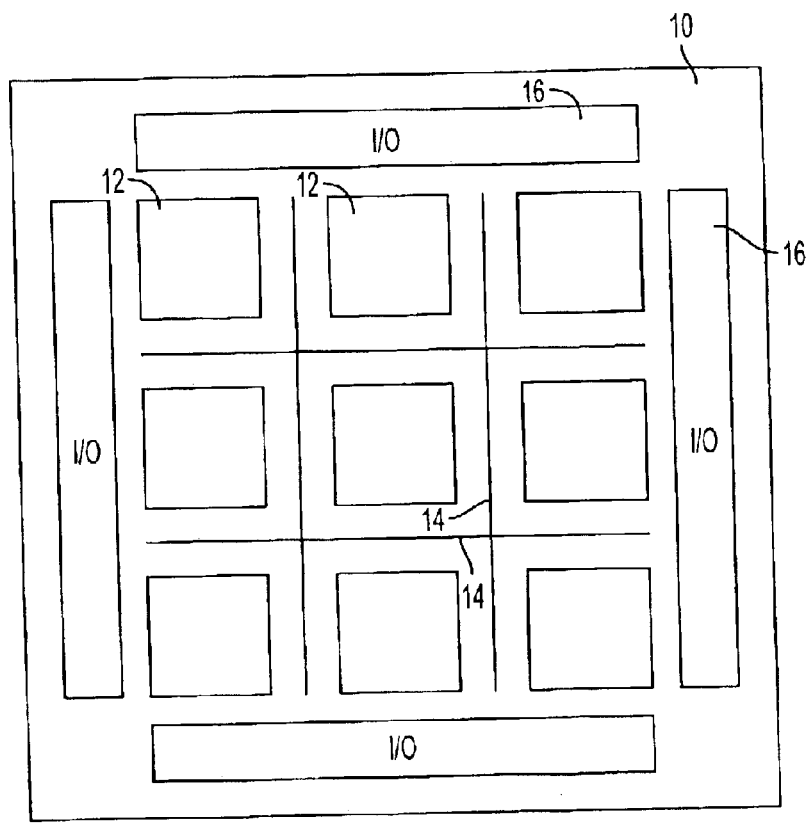
FIG. 1 is a simplified block diagram of an illustrative programmable logic device in accordance with the present invention.

An illustrative programmable logic device 10 in accordance with this invention is shown in FIG. 1. Device 10 may have a number of rows and columns of regions 12 of programmable logic. Regions 12 may be disposed on device 10 in a two-dimensional array of, for example, 5–300 rows and 5–300 columns of regions 12 or any other suitably-sized array.

The logic in regions 12 may be interconnected using interconnection resources such as vertical and horizontal conductors 14. Such conductors may, for example, include relatively large inter-region conductors that extend past all or some of the logic regions 12 in a row or column. There may be any suitable number of conductors 14. For example, there may be about 10–30 conductors 14 in each row and each column of regions 12. Programmable logic may be used to selectively connect all or a subset of the conductors 14 in each row or column to the associated logic regions 12 in that column. If desired, programmable logic may also be used to directly interconnect the vertical and horizontal conductors 14. The conductors 14 may be continuous or segmented and, if segmented, may be programmably connected to serve as continuous conductors.

Input-output circuitry 16 may be used to interconnect the logic of device 10 to external components (e.g., through I/O pads connected to pins in a package). Additional circuitry may also be used such as circuitry for programming and testing device 10. To avoid over-complicating the drawing, details of the programmable logic interconnections and programming and testing circuitry of device 10 are not shown in FIG. 1. Moreover, the arrangement of FIG. 1 is merely illustrative. Any suitable programmable logic device architecture may be used for device 10 if desired.

Programmable logic device 10 may be shipped to a customer ("user") in a substantially unprogrammed condition. The customer may use equipment (referred to as a device "programmer") to program or configure the device 10 so that device 10 performs a desired custom logic function and so that the input-output circuitry 16 provides desired I/O functionality. Sometimes two or more conductors must be selectively connected to a third conductor. This type of function may be performed using programmable logic connectors ("PLCs"). An example of a PLC is a programmable multiplexer. Programmable logic connectors and other components on device 10 are typically controlled by programmable function control elements ("FCEs"). A programmable function control element may, for example, be based on a programmable cell. Programmable function control elements are designated by the letter "R" in the drawings.

The programmable logic connectors and function control elements on device 10 may be configured by a user to implement desired logic functions on programmable logic device 10 and to configure the input-output circuitry. For example, the state of a two-input multiplexer may be controlled by programming an associated FCE to output either a "0" or a "1." If the FCE supplies a "O," the first input of the multiplexer will be connected to its output. Programming the FCE so that the FCE supplies a "1," will direct the multiplexer to connect its second input to its output. Components such as current sources, voltage sources, and other circuitry may also be programmably controlled by FCEs. By controlling this circuitry with the FCES, I/O circuitry 16 may be configured to handle various different I/O signaling standards. Illustrative standards that may be handled by device 10 include high-speed differential signaling standards such as the low-voltage pseudo-emitter-coupled logic (LVPECL) standard, the pseudo current mode logic (PCML) standard, and the low-voltage differential signaling (LVDS) standard. Additional standards such as LTD, CML, GTL, PCI, PCIX, HSTL, SSTL, and other suitable standards may also be handled by I/O circuitry 16.

Figure 2:
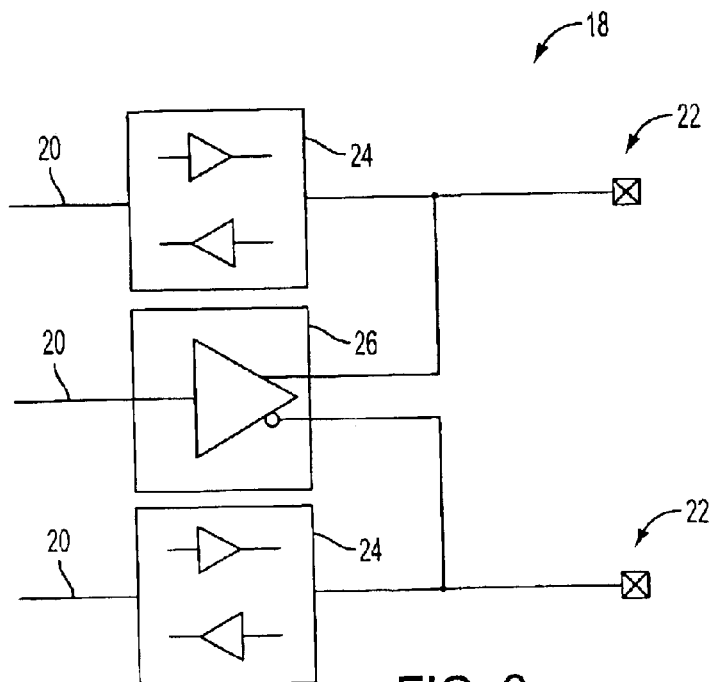
FIG. 2 is a schematic diagram of a known I/O circuit arrangement for a programmable logic device.

As shown in FIG. 2, some conventional programmable logic devices have programmable I/O circuitry 18 that may be used to convey data signals between interior signal lines 20 and I/O lines and pads 22. Output data is provided from lines 20 to output lines 22 for use elsewhere in the system. Input data that is received at lines 22 is provided to lines 20 for processing by the logic of the device. Programmable driver circuits 24 may each be configured as either a single-ended (one pin) output driver (sometimes called a buffer) or a single-ended input driver. Programmable driver circuit 26 is a differential output driver circuit that is used for handling faster data rates than those handled by driver circuits 24. Driver circuit 26 takes signals from a single line 20 and drives it onto a pair of I/O lines 22. Similar programmable differential input driver circuits are also used.

I/O circuits 24 and 26 are programmable so that they may be configured as needed by a user to accommodate different I/O signaling standards. However, providing such flexibility can create performance limitations. In particular, the outputs of driver circuit 26 (or the comparable inputs of a differential receiver on the device) experience a non-negligible amount of loading due to the connection of I/O circuits 24 to I/O lines and due to the capacitance of pads 22. Fairly wide conductors are used between the circuits 24 and I/O lines and pads 22, so that circuits 24 and I/O lines and pads 22 can properly supply the largest signals required by the most demanding of the supported signaling standards. Circuits 24 and 26 also contain special programmable circuitry for supplying the various combinations of currents and voltages required by the different standards. The electrical connection of the wide (high-capacitance) conductors and the special programmable circuitry to the output lines of the differential drivers tends to load down the differential drivers, reducing the maximum speed at which signals in circuitry 18 may be driven onto the output lines.

In accordance with the present invention, high-speed I/O circuitry is provided that supports high data rates. The high-speed I/O circuitry may include differential input drivers and differential output drivers. To enhance the high speed capabilities of the high-speed I/O circuitry, the lines connecting the high-speed drivers to the I/O lines and pads on the programmable logic device may be segregated from the lines used to connect the I/O lines and pads to lower-speed I/O circuitry.

Because the high-speed I/O circuitry and low-speed I/O circuitry are not directly electrically connected to each other, the lower-speed I/O circuitry does not load the higher-speed I/O circuitry. This allows the lower-speed I/O circuitry to be programmable to support multiple I/O signaling standards without adversely affecting the speed of the higher-speed circuitry. If desired, the high-speed I/O circuitry may have few or no programmable capabilities, thereby maximizing high-speed performance. With this approach, a high level of high-speed performance is maintained while the flexibility of multiple signaling standards is provided by the lower-speed I/O circuitry.

Figure 3A:
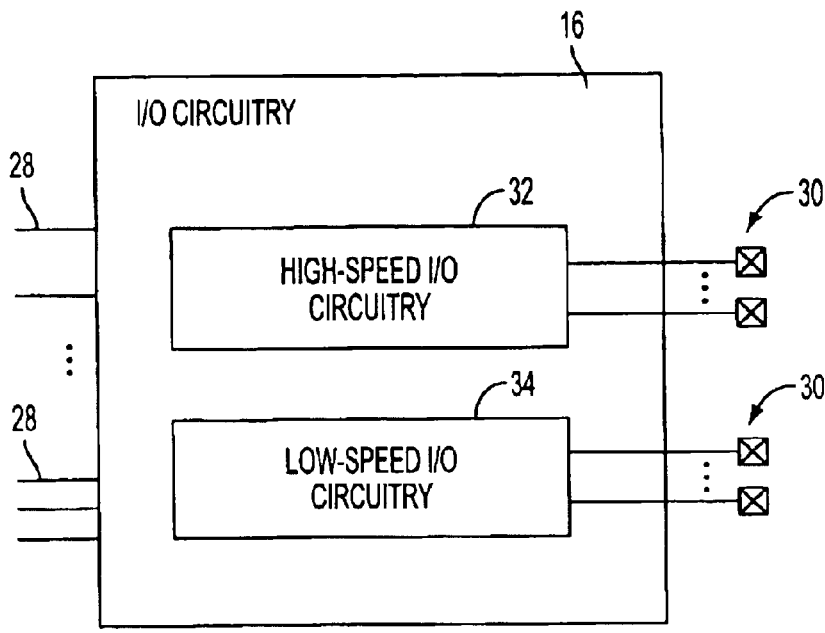
FIG. 3a is a circuit diagram of illustrative I/O circuitry that has been organized in two groups by I/O speed in accordance with the present invention.

The I/O circuitry may be divided into two portions as shown in FIG. 3a. High-speed I/O circuitry 32 and low-speed I/O circuitry 34 are used to convey signals between interior lines 28 and I/O lines and pads 30 (sometimes referred to herein simply as "I/O lines" or "output lines" or "input lines" as appropriate). With the arrangement of FIG. 3a, high-speed I/O circuitry 32 and low-speed I/O circuitry 34 are not directly connected to each other by lines or electrical conductors in the region of I/O lines and pads 30. Rather, some of the I/O lines and I/O pads 30 are directly electrically connected to the high-speed I/O circuitry 32 and other I/O lines and I/O pads 30 are directly electrically connected to low-speed I/O circuitry 34.

The high-speed I/O circuitry 32 may have little or no flexibility to handle multiple I/O signaling standards. The low-speed I/O circuitry 34 may have programmable circuits that allow circuitry 34 to be reconfigured as desired to handle different signaling standards. These are merely illustrative arrangements. Any suitable amount of reconfigurability may be provided in each of the circuitry portions.

Moreover, although shown as separate blocks in the drawing, the circuit elements (e.g., the transistors, conductors, and other components) of circuitry 32 and circuitry 34 may be laid out on the surface of device 10 using any suitable arrangement. As an example, the high-speed drivers of circuitry 32 and the low-speed drivers of circuitry 34 may be intertwined (e.g., so that alternating pins along the periphery of device 10 have either fast or slow I/O circuitry associated with them). As another example, all of the low-speed drivers may be provided on one side of the integrated circuit of device 10 and all of the high-speed drivers may be provided on the other side of the integrated circuit of device 10. Another suitable arrangement involves providing circuitry 32 as a number of sub-regions, each subregion having an associated group of adjacent I/O pins. Circuitry 34 may also be provided using such a sub-region arrangement. Any suitable combination of these approaches or other suitable approaches for dividing the I/O circuitry 16 into separate portions such as portions 32 and 34 may be used if desired.

The number of I/O lines that are associated with each type of I/O circuitry typically depends on the I/O requirements of the device. For devices 10 that require large amounts of high-speed I/O capabilities, many of the I/O lines 30 may be dedicated to high-speed I/O signals. For devices 10 that require large amounts of reconfigurability, most of the I/O lines 30 (e.g., hundreds of I/O lines) may be dedicated to supporting low-speed I/O signals and relatively fewer high-speed I/O lines (e.g., tens of I/O lines) may be provided.

Figure 3B:
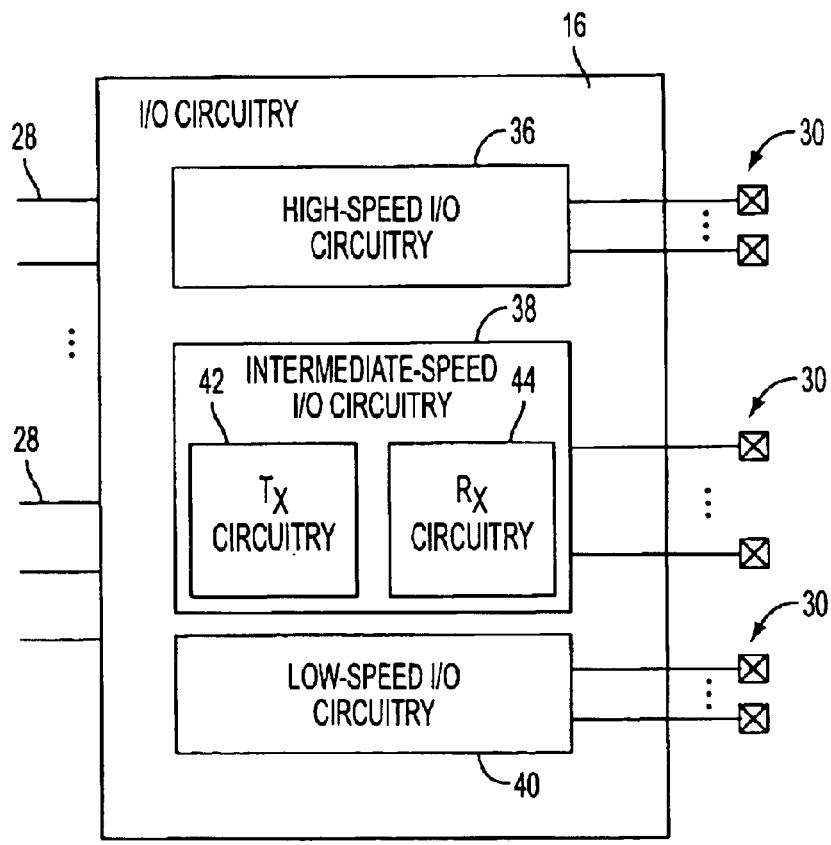
FIG. 3b is a circuit diagram of illustrative I/O circuitry that has been organized in three groups by I/O speed in accordance with the present invention.

If desired, there may be three or more different types or portions of I/O circuitry within I/O circuitry 16. For example, there may be three different types of I/O circuitry, as shown in FIG. 3b. In the example of FIG. 3b, I/O circuitry 16 has high-speed I/O circuitry 36, intermediate-speed I/O circuitry 38, and low-speed I/O circuitry 40. As described in connection with FIG. 3a, the circuit components of circuitry 36, 38, and 40 may be intertwined, may be divided into non-overlapping blocks, may be distributed around device 10 in the form of subregions, or may be distributed on device 10 using any other suitable scheme or combinations of such approaches.

Any desired amount of reprogrammable functionality may be provided to each of the three types of circuitry in FIG. 3b. For example, high-speed I/O circuitry 36 may have little or no programmability thereby maximizing high-speed performance for circuitry 36 while foregoing a certain amount of flexibility with respect to handling different I/O signaling standards. Low-speed I/O circuitry 40 may have a relatively larger amount of reprogrammable capabilities, so that low-speed I/O circuitry 40 may support a relatively larger number of different I/O signaling standards, albeit at a reduced data rate. Intermediate-speed I/O circuitry 38 may have the same or more programmable functionality than high-speed I/O circuitry 36 and the same or less programmable functionality than low-speed I/O circuitry 40.

Each of the different types of circuitry shown in FIGS. 3a and 3b may have transmitter circuitry (output drivers) and receiver circuitry (input drivers) or may have only transmitters or only receivers. The presence of transmitter and receiver circuitry in each of the different types of I/O circuits is shown by illustrative transmitter circuitry 42 and receiver circuitry 44 in intermediate-speed circuitry 38 of FIG. 3b.

Any suitable number of I/O lines 30 may be associated with each portion of circuitry 32 and 34 (FIG. 3a) and with each portion of circuitry 36, 38, and 40 (FIG. 3b). As an example, circuitry 32 may have differential output driver circuitry for providing outputs onto 1–20 associated pairs of I/O lines 30 (serving as output lines) and may have differential input driver circuitry for receiving inputs from 1–20 associated pairs of I/O lines 30 (serving as input lines). Circuitry 34 may have 400–500 programmable single-ended driver circuits that are connected to associated I/O lines 30 and that may be configured as either input drivers or output drivers.

In the I/O circuitry 16 of FIG. 3b, there may be 1–20 I/O line pairs associated with differential input drivers in circuitry 36 and 1–20 I/O line pairs associated with differential output drivers in circuitry 36. Intermediate-speed circuitry 38 may have 1–60 differential driver pairs (for inputs and outputs) and may or may not have additional single-ended I/O drivers. Low-speed I/O circuitry 40 may have 400–500 associated I/O lines 30. Programmable single-ended drivers in circuitry 40 may be configured to receive input signals from I/O lines 30 and to provide those signals to appropriate internal lines 28. The programmable single-ended drivers in circuitry 40 may also be configured to provide signals from internal lines 28 to I/O lines 30 as output signals.

There may be any suitable number of different types of I/O circuitry portions in I/O circuitry 16 (e.g., two types—high and low—as shown in FIG. 3a, three types—high, intermediate, and low—as shown in FIG. 3b, or more than three types). Any suitable number of I/O lines and pins 30 may be associated with each type of circuitry. Each portion of I/O circuitry may have only input driver circuitry, only output driver circuitry, or both input and output driver circuitry (e.g. transmitter and receiver circuitry such as transmitter and receiver circuitry 42 and 44 of FIG. 3b.). Any suitable amount of programmability may be provided to each type of I/O circuitry so that the distribution of the programmability capabilities of device 10 optimizes the overall performance and flexibility of device 10 for a desired application while preserving desired high-performance capabilities.

Figure 4:
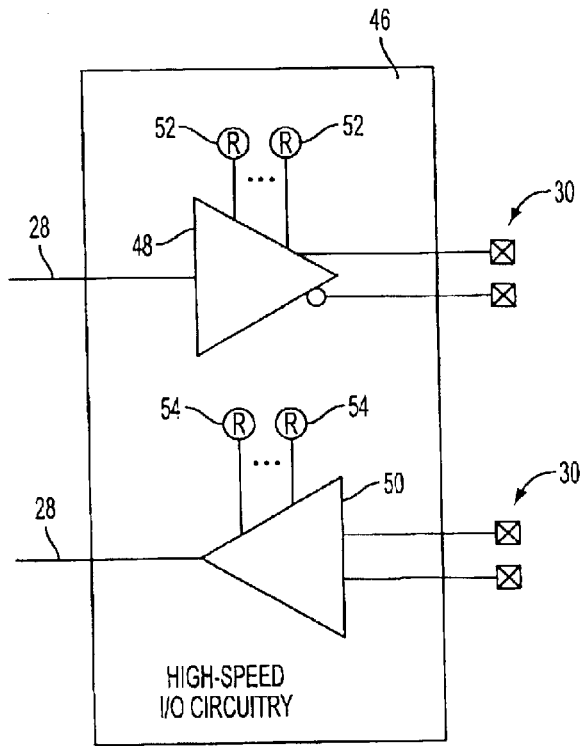
FIG. 4 is a diagram of illustrative high-speed I/O circuitry in accordance with the present invention.

An illustrative arrangement that may be used for high-speed I/O circuitry such as high-speed I/O circuitry 32 of FIG. 3a or high-speed circuitry 36 of FIG. 3b is shown in FIG. 4. High-speed circuitry 46 of FIG. 4 may have differential output drivers such as differential output driver 48 and may have differential input drivers such as differential input driver 50. Each differential output driver 48 may be used to drive a data stream of output signals from an internal conductor 28 of device 10 as differential output signals on a corresponding pair of I/O lines and pads 30 (which are serving as output lines and output pads). Each input driver 50 may be used to receive differential input signals from a pair of I/O lines and pads 30, which are provided to a corresponding internal line 28 as a data stream.

Driver circuitry 48 and so may be configured as desired by a user by programming function control elements 52 and 54. If desired, function control elements 52 and 54 may be omitted on circuitry 48 or 50 (or both). By providing less programmability, the performance of I/O driver circuits 48 and 50 may be significantly improved. For example, circuits 48 and 50 (particularly when fixed and not configurable and when operated differentially) may support data rates of 3.125 Gbps or 6.25 Gbps or higher.

Figure 5:
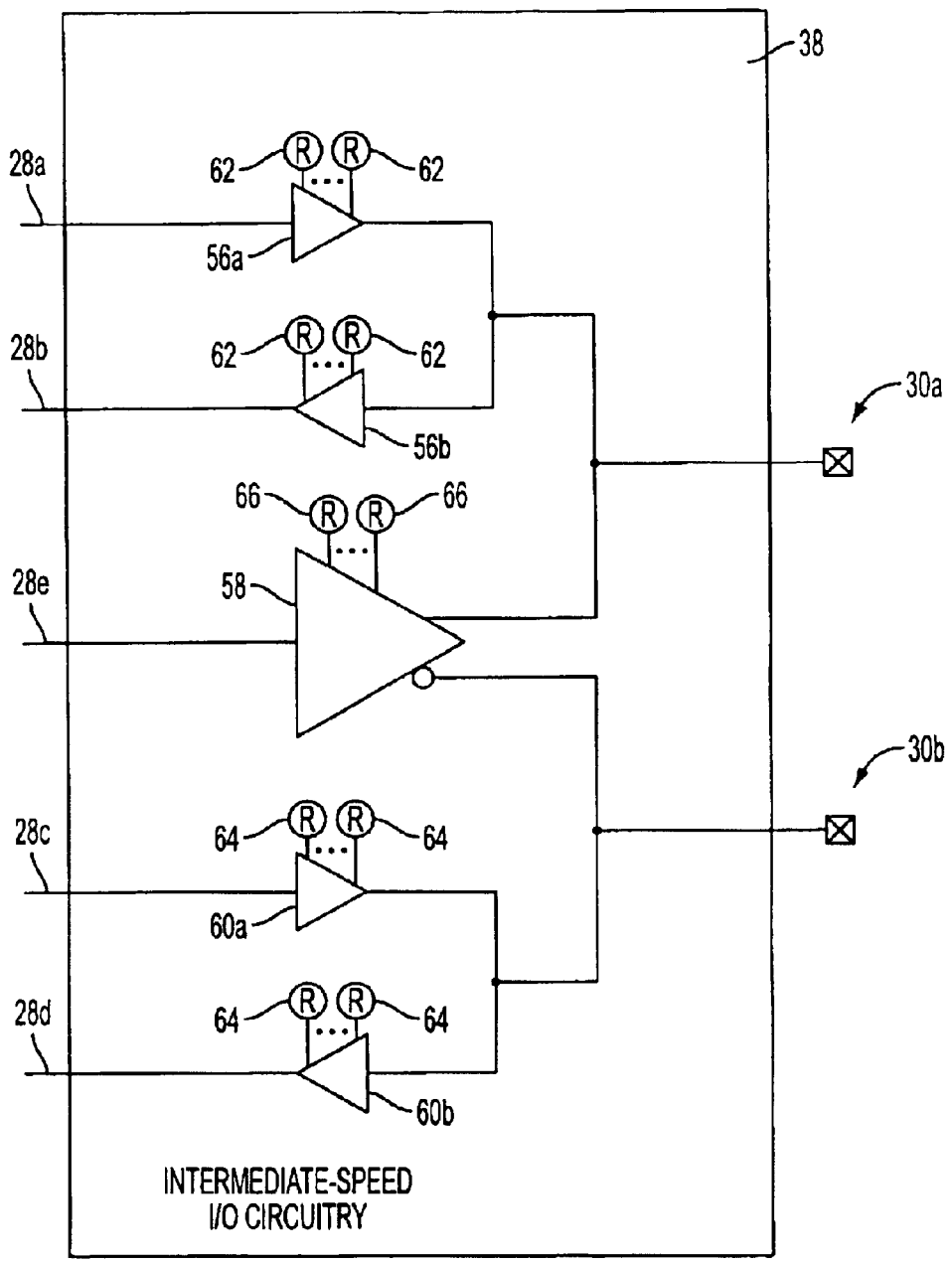
FIG. 5 is a diagram of illustrative intermediate-speed I/O circuitry in accordance with the present invention.

Illustrative intermediate-speed I/O circuitry 38 is shown in FIG. 5. In the example of FIG. 5, intermediate-speed I/O circuitry 38 has single-ended output driver 56a for driving output data signals from line 28a onto I/O line and pad 30a and has single-ended input driver 56b for receiving input data signals from I/O line and pad 30a and for providing those received signals to internal line 28b. Function control elements such as function control elements 62 may be used to configure circuitry 56a and 56b (e.g., to accommodate different I/O signaling standards and to configure I/O line 30a as either an input or an output). Intermediate-speed I/O circuitry 38 may also have single-ended output driver 60a for driving output data signals from line 28c onto I/O line and pad 30b and single-ended input driver 60b for receiving input data signals from I/O line and pad 30b and for providing those received signals to internal line 28d. Function control elements such as function control elements 64 may be used to configure circuitry 60a and 60b (e.g., to accommodate different I/O signaling standards and to configure I/O line 30b as either an input or an output).

Intermediate-speed I/O circuitry 38 may have differential input drivers and differential output drivers such as differential I/O output driver 58 (also shown as transmitter circuitry 42 and receiver circuitry 44 in FIG. 3b). Differential output driver 58 drives output data signals that are provided on internal line 28e onto I/O lines and pads 30a and 30b as differential output signals. Function control elements 62 and 64 may be used to deactivate circuits 56a and 56b and circuits 60a and 60b when differential circuitry 58 is in use and vice versa.

The maximum data rate sustained by differential output driver 58 may be equal to or less than the maximum data rate handled by high-speed circuitry 36 (FIG. 3b) and equal to or greater than the maximum data rate handled by low-speed I/O circuitry 40 (FIG. 3b). For example, the maximum data rate of the differential I/O circuitry in intermediate-speed I/O circuitry 38 may be on the order of 0.1–2 Gbps (e.g., 0.6–1.25 Gbps) or may be any other suitable rate.

Function control elements 62 and 64 may be used to configure single-ended I/O driver circuitry such as single-ended I/O driver circuitry 56a and 56b and circuitry 60a and 60b to support a desired one of multiple I/O signaling standards. If desired, differential I/O driver circuitry in I/O circuitry 38 such as differential output driver 58 may be configured using optional function control elements 66 (which need not be provided if desired).

The extent of the programmability available from function control elements 66 and circuitry 58 may make the differential I/O section of intermediate-speed circuitry 38 more programmable and more flexible than the non-configurable or slightly-configurable differential I/O circuitry of high-speed I/O circuitry 36, although this will generally result in a correspondingly reduced maximum data rate.

The single-ended I/O circuitry of circuitry 38 (e.g., circuits 56a and 56b and circuits 60a and 60b) may be as flexible or less flexible (i.e., supporting fewer different I/O signaling standards) than the I/O circuitry in low-speed circuitry 40 (FIG. 3b), which allows circuits 56a and 56b and circuits 60a and 60b to support higher data rates than the I/O circuitry in low-speed circuitry 40.

Figure 6:
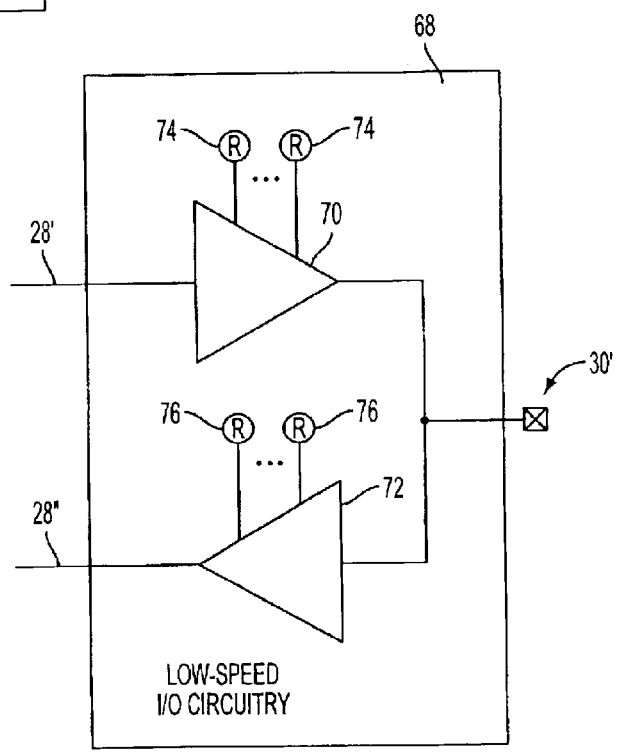
FIG. 6 is a diagram of illustrative low-speed I/O circuitry in accordance with the present invention.

Illustrative low-speed I/O circuitry 68, which may be used as low-speed I/O circuitry 40 of FIG. 3b or low-speed I/O circuitry 34 of FIG. 3a, is shown in FIG. 6. Circuitry 68 may have output drivers such as output driver 70 for conveying signals from internal lines such as internal line 28' onto output lines and pads such as output lines and pads 30'. Output driver 70 may be configured (e.g., to support a desired I/O signaling standard) using function control elements 74. Circuitry 68 may have input drivers such as input driver 72 for conveying signals from I/O lines and pads such as I/O line and pad 30' onto appropriate internal lines such as line 28". Input driver 72 may be configured (e.g., to support a desired I/O signaling standard) using function control elements 76.

Circuitry 68 may be more flexible (i.e., may support more different I/O signaling standards) than intermediate-speed I/O circuitry 38 (FIG. 5), which generally makes the maximum data rate that is sustainable by low-speed I/O circuitry 68 (e.g., less than 0.6 Gbps or any other suitable amount) less than that of the intermediate-speed I/O circuitry 38 (or at least less than the differential I/O portion of the intermediate-speed I/O circuitry 38).

The receiver circuitry of I/O circuitry 16 is generally more susceptible to loading effects than the transmitter circuitry. It is therefore generally preferably to support fewer different I/O standards with the I/O receiver circuitry than are supported by the I/O transmitter circuitry. Because a larger number of different I/O signaling standards may be supported by the output driver circuitry than by the input driver circuitry while maintaining the same general data rates, the overall performance of I/O circuitry 16 may be maximized by paying the most attention to reducing the flexibility (programmability) of the input driver circuitry (e.g., to support only one I/O signaling standard or to support a relatively small number of I/O signaling standards as compared to the relatively larger number that can be supported by the transmitter or output driver I/O circuitry operating at the same data rates).

More flexible I/O driver circuitry (i.e., I/O circuitry that may be programmably reconfigured to handle relatively more different I/O signaling standards) is generally less suitable for handling high-speed I/O data rates than less flexible I/O driver circuitry. One reason that this is true is that certain I/O signaling standards require the use of larger transistors so that the circuitry will tolerate high voltages. The use of such larger transistors makes it more difficult for the I/O driver circuitry to provide sufficient currents at low voltages, unless the transistors are made still larger. Thus, when support for a large number of I/O signaling standards is required, I/O data rate performance is generally reduced.

Figure 7:
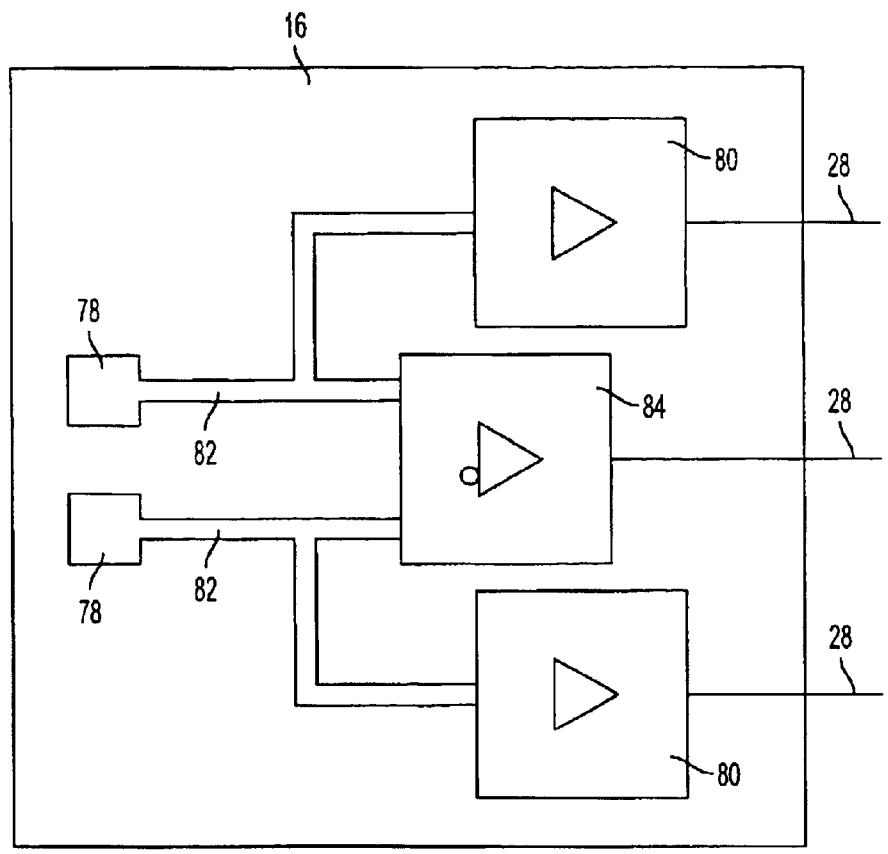
FIG. 7 is a partially-schematic plan view of the input circuitry portion of an illustrative programmable logic device in accordance with the present invention.

In addition to separating the higher-speed and lower-speed I/O circuitry, overall performance of I/O circuitry 16 may be enhanced by reducing the capacitances of the I/O lines and I/O pads that are associated with the input and output drivers (and particularly those for the input drivers). An illustrative plan view of a portion of I/O circuitry 16 with I/O pads 78 is shown in FIG. 7. In the portion of circuitry 16 that is shown in FIG. 7, I/O pads 78 are being used as input pads. Single-ended input drivers 80 are directly connected to the same I/O lines 82 as differential input driver 84. The non-zero widths of the lines 82 and the areas taken up by pads 78 contribute capacitance to lines 82 that can adversely affect the data rate performance of I/O circuitry 16.

The lines 82 and pads 78 are generally formed form a top layer of metal. The flip-chip solder-bonding technique or any other technique may be used to attach device 10 to a package. Such packaging techniques generally involve bonding or otherwise electrically connecting the package to the pads 78.

Figure 8:
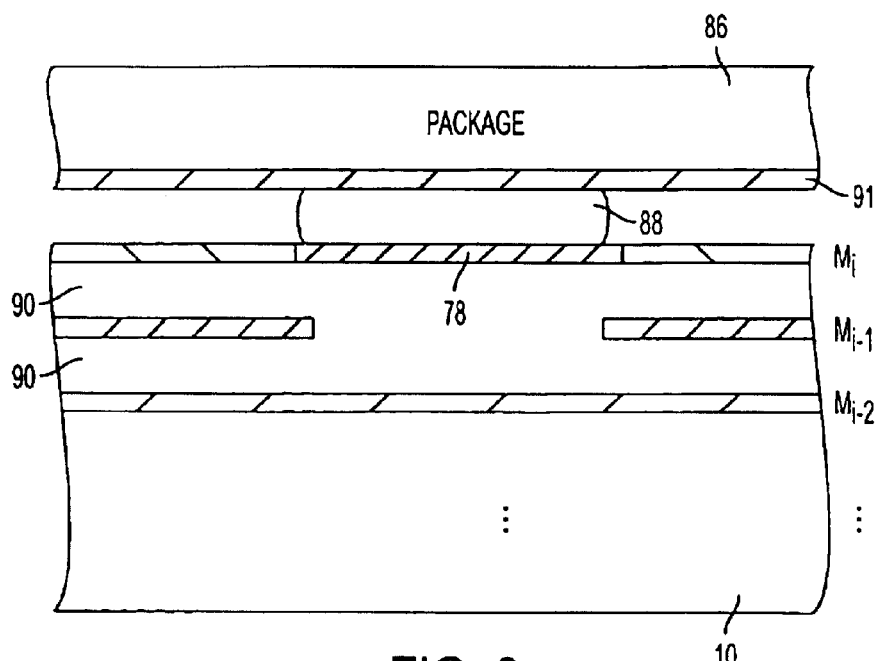
FIG. 8 is a cross-sectional side view of an illustrative flip-chip solder bump pad and metallization arrangement that may be used by I/O circuitry on a programmable logic device in accordance with the present invention.

Line widths are preferably kept as small as possible to minimize loading. The capacitance of pads 78 may be reduced by minimizing or eliminating the amount of metal underlying the top layer of pads 78 (i.e., by minimizing the metal in buried layers). A cross-sectional side view of a device 10 and an associated package 86 are shown in FIG. 8. A solder ball 88 provides electrical connection between the metal conductors 91 on the surface of package 86 and the top metal layer $M_i$ on device 10. There is preferably a solder ball 88 directly on top of each pad 78.

The I/O lines and pads 30 of circuitry 16 (shown as pads 78 and lines 82 in FIG. 7) are patterned from metal layer $M_i$. Layers of insulating material 90 separate metal layers $M_i$ from each other. The metal layers that are buried two or more layers beneath top layer $M_i$ (e.g., layers $M_{i-2}$, $M_{i-3}$, etc.) tend to have relatively little impact on the capacitance of the pad 78. However, the amount of metal in metal layer $M_{i-1}$ that lies directly beneath pad 78 has a substantial impact on pad capacitance and therefore on the amount of loading on I/O lines 30 or 82. Accordingly, I/O data rate performance may be enhanced by minimizing the amount of metal in the metal layer $M_{i-1}$, which lies directly beneath pad 78. If desired, there may be no metal in layer $M_{i-1}$ directly beneath the pad area in metal layer $M_i$, as shown in FIG. 8. Other suitable arrangements involve setting a predefined limit on the amount of underlying metal. Performance may be enhanced, for example, by ensuring that 10%–90%, 10–30%, 10–50%, 20–40%, 20–80%, 30–70%, 40–60%, less than 90%, less than 80%, less than 70%, less than 60%, less than 50%, less than 40% or any other suitable fraction of the area of pad 78 lies above corresponding metal in buried metal layer $M_{i-i}$ (the layer of metal that lies one metal layer beneath the top layer of metal $M_i$).

Figure 9:
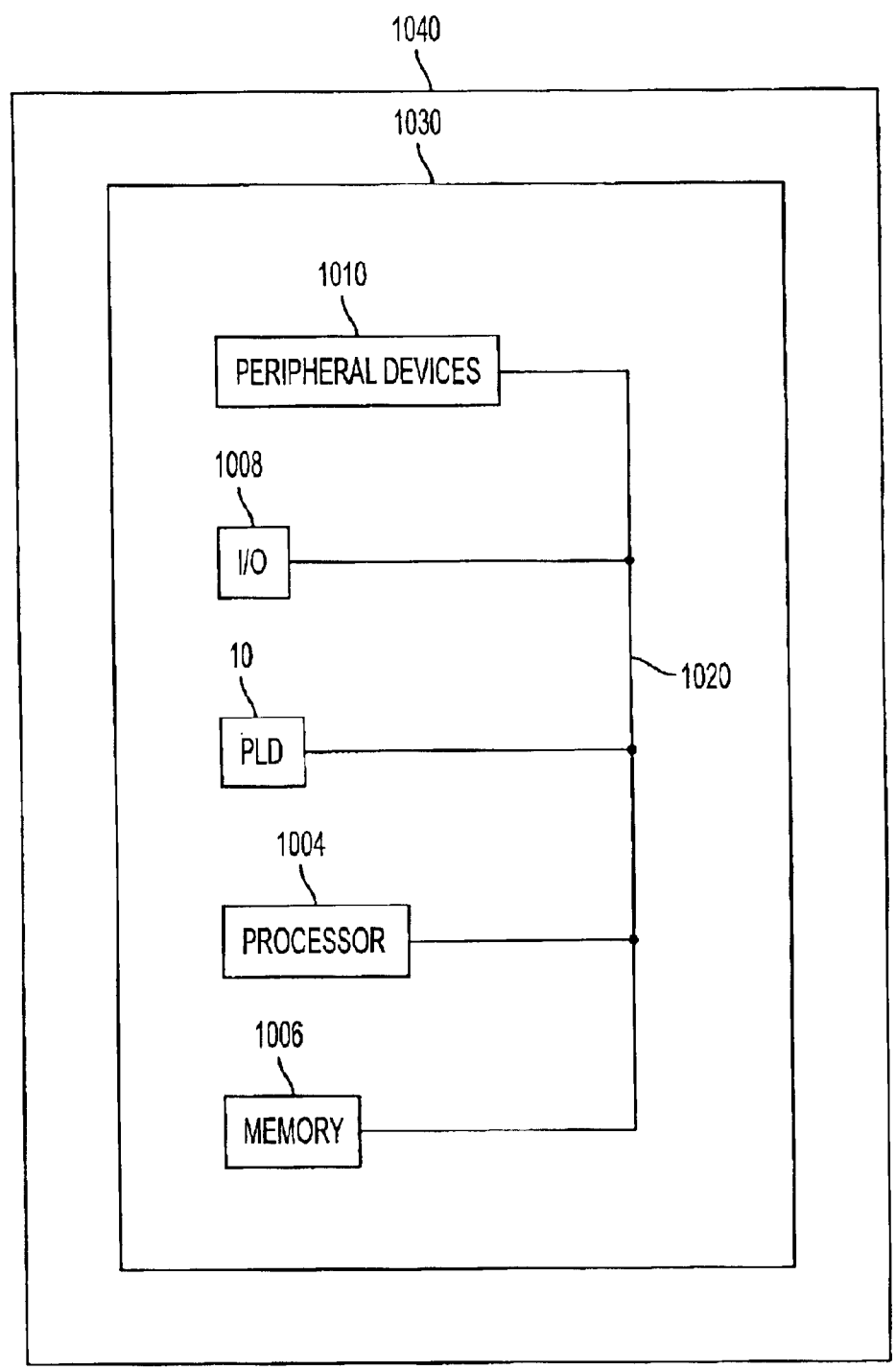
FIG. 9 is a simplified block diagram of an illustrative system employing a programmable logic device in accordance with the present invention.

FIG. 9 illustrates a programmable logic device 10 of this invention in a data processing system 1002. Data processing system 1002 may include one or more of the following components: a processor 1004; memory 1006; I/O circuitry 1008; and peripheral devices 1010. These components are coupled together by a system bus 1020 and are populated on a circuit board 1030 which is contained in an end-user system 1040.

System 1002 can be used in a wide variety of applications, such as computer networking, data networking, instrumentation, video processing, digital signal processing, or any other application where the advantage of using programmable or reprogrammable logic is desirable. Programmable logic device 10 can be used to perform a variety of different logic functions. For example, programmable logic device 10 can be configured as a processor or controller that works in cooperation with processor 1004. Programmable logic device 10 may also be used as an arbiter for arbitrating access to a shared resource in system 1002. In yet another example, programmable logic device 10 can be configured as an interface between processor 1004 and one of the other components in system 1002. It should be noted that system 1002 is only exemplary, and that the true scope and spirit of the invention should be indicated by the following claims.

Various technologies can be used to implement programmable logic devices 10 having the features of this invention, as well as the various components of those devices (e.g., the above-described PLCs and the FCEs that control the PLCs) For example, each PLC can be a relatively simple programmable connector such as a switch or a plurality of switches for connecting any one of several inputs to an output. Alternatively, each PLC can be a somewhat more complex element which is capable of performing logic (e.g., by logically combining several of its inputs) as well as making a connection. In the latter case, for example, each PLC can be product term logic, implementing functions such as AND, NAND, OR, or NOR. Examples of components suitable for implementing PLCs are EPROMs, EEPROMs, pass transistors, transmission gates, antifuses, laser fuses, metal optional links, etc. As has been mentioned, the various components of PLCs can be controlled by various, programmable, function control elements ("FCEs"). (With certain PLC implementations (e.g., fuses and metal optional links) separate FCE devices are not required.) FCEs can also be implemented in any of several different ways. For example, FCEs can be SRAMs, DRAMs, first-in first-out ("FIFO") memories, EPROMs, EEPROMs, function control registers (e.g., as in Wahlstrom U.S. Pat. No. 3,473,160), ferro-electric memories, fuses, antifuses, or the like. From the various examples mentioned above it will be seen that this invention is applicable to both one-time-only programmable and reprogrammable devices.

It will be understood that the forgoing is only illustrative of the principles of the invention, and that various modifications can be made by those skilled in the art without departing from the scope and spirit of the invention. For example, the numbers of the various types of resources on device 10 can be different from the numbers present in the depicted and described illustrative embodiments. This applies to such parameters as the numbers of rows and columns of the various types of circuitry, the number of regions 12, the numbers of the various types of interconnection conductors, the number and types of I/O drivers, and the numbers and sizes of the FCEs used to control the circuitry. The logic used in programmable logic device 10 to perform various programmable logic functions may be look-up table logic. It will be understood that other types of logic may sometimes be used instead if desired. For example, sum-of-products logic may sometimes be used instead of look-up table logic. Although illustrated herein in the context of a particular programmable logic device architecture, it will be understood that various aspects of the invention are equally applicable to other programmable logic devices and integrated circuits as well.

The invention claimed is:

1. A programmable logic device integrated circuit that is programmable by a user, comprising:
   programmable logic;
   I/O circuitry having I/O lines; and
   a plurality of internal lines that convey data signals from the programmable logic to the I/O circuitry, wherein the I/O circuitry conveys signals between the I/O lines and the internal lines, the I/O circuitry comprising:
      high-speed I/O circuitry including differential I/O drivers connected to some of the I/O lines; and
      low-speed I/O circuitry including a plurality of programmable I/O drivers connected to some of the I/O lines that the user may configure to handle different I/O signaling standards, wherein the high-speed I/O circuitry operates at a higher maximum data rate than the low-speed I/O circuitry and wherein the high-speed I/O circuitry and the low-speed I/O circuitry are not directly electrically connected to any of the same I/O lines.

2. The programmable logic device defined in claim 1 wherein the differential I/O drivers in the high-speed I/O circuitry are not programmable to support multiple I/O signaling standards.

3. The programmable logic device defined in claim 1 wherein the high-speed I/O circuitry is programmable so that the user may configure the high-speed I/O circuitry to handle different I/O signaling standards.

4. The programmable logic device defined in claim 1 wherein the I/O circuitry further comprises intermediate-speed I/O circuitry that handles a maximum data rate that is between the maximum data rate handled by the high-speed I/O circuitry and the maximum data rate handled by the low-speed I/O circuitry.

5. The programmable logic device defined in claim 4 wherein the intermediate-speed I/O circuitry is programmable so that the user may configure the intermediate I/O circuitry to handle different I/O signaling standards.

6. The programmable logic device defined in claim 5 wherein the intermediate-speed I/O circuitry supports fewer different I/O signaling standards than are supported by the low-speed I/O circuitry.

7. The programmable logic device defined in claim 5 wherein the intermediate-speed I/O circuitry includes transmitter circuitry and receiver circuitry that handle multiple different I/O signaling standards and wherein the receiver circuitry supports fewer different I/O signaling standards than the transmitter circuitry.

8. The programmable logic device defined in claim 1 wherein the maximum I/O data rate supported by the high-speed I/O circuitry is in the range of 3.125–6.25 Gbps.

9. The programmable logic device defined in claim 1 wherein the maximum I/O data rate supported by the low-speed I/O circuitry is less than 0.6 Gbps.

10. The programmable logic device defined in claim 1 further comprising I/O pads formed from a top layer of metal, wherein the I/O pads each have an I/O pad area, wherein the programmable logic device has a buried layer of metal that lies one metal layer beneath the top layer of metal, and wherein less than 70% of the I/O pad area for at least some of the I/O pads lies above corresponding metal in the buried layer.

11. The programmable logic device defined in claim 10 wherein the I/O pads with less than 70% of the I/O pad area lying above corresponding metal in the buried layer are connected to input drivers in the I/O circuitry.

12. The programmable logic device defined in claim 1 wherein there are more I/O lines connected to the low-speed I/O circuitry than the high-speed I/O circuitry.

13. Input-output circuitry on an integrated circuit device, comprising:

first I/O circuitry having a maximum data rate and having a plurality of non-programmable differential I/O drivers that are electrically connected to a plurality of corresponding pairs of I/O lines and pads; and second I/O circuitry having a maximum data rate lower than the maximum data rate of the first I/O circuitry, wherein the second I/O circuitry is programmable by a user to support a desired one of multiple different I/O signaling standards, wherein the second I/O circuitry is connected to a plurality of I/O lines and pads, and wherein none of the plurality of I/O lines and pads that are electrically connected to the differential I/O drivers of the first circuitry are also directly electrically connected to any of the plurality of I/O lines and pads of the second I/O circuitry.

14. The input-output circuitry defined in claim 13 further comprising third I/O circuitry capable of supporting a maximum data rate that is less than the maximum data rate of the first I/O circuitry and more than the maximum data rate of the second I/O circuitry.

15. The input-output circuitry defined in claim 14 wherein the third I/O circuitry comprises programmable output driver circuitry and programmable input driver circuitry, wherein the programmable output driver circuitry may be configured by the user to support a greater number of different I/O signaling standards than the programmable input driver circuitry.

16. The input-output circuitry defined in claim 13 wherein the maximum data rate of the first I/O circuitry is greater than or equal to 3.125 Gbps.

17. The input-output circuitry defined in claim 13 wherein there are hundreds of I/O lines and pins that are directly electrically connected to the second I/O circuitry.

18. The input-output circuitry defined in claim 17 wherein there are from 1 to 20 pairs of I/O lines and pads connected to the differential I/O drivers.

19. The input-output circuitry defined in claim 15 further comprising third I/O circuitry capable of supporting a maximum data rate that is less than the maximum data rate of the first I/O circuitry and more than the maximum data rate of the second I/O circuitry, wherein the third circuitry comprises differential I/O drivers and single-ended I/O drivers.

20. The input-output circuitry defined in claim 19 wherein the single-ended I/O drivers are programmable by the user to support a desired one of a plurality of different I/O signaling standards.

* * * * *